(12) United States Patent  
Ahmed et al.

(10) Patent No.: US 10,845,609 B2  
(45) Date of Patent: Nov. 24, 2020

(54) DIFFRACTIVE OPTICAL ELEMENTS FOR WIDE FIELD-OF-VIEW VIRTUAL REALITY DEVICES AND METHODS OF MANUFACTURING THE SAME

(71) Applicant: Intel Corporation, Santa Clara, CA (US)

(72) Inventors: Khaled Ahmed, Anaheim, CA (US); Ali Khakifirooz, Los Altos, CA (US); Prashant Majhi, San Jose, CA (US); Kunjal Parikh, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 176 days.

(21) Appl. No.: 16/022,158

(22) Filed: Jun. 28, 2018

(65) Prior Publication Data

US 2019/0041656 A1 Feb. 7, 2019

(51) Int. Cl.  
*G02B 27/42* (2006.01)  
*G02B 27/01* (2006.01)  
(Continued)

(52) U.S. Cl.  
CPC ......... *G02B 27/42* (2013.01); *G02B 27/0172* (2013.01); *G06T 19/006* (2013.01);  
(Continued)

(58) Field of Classification Search  
CPC .............. G02B 27/42; G02B 27/4205; G02B 27/4211; G02B 27/4216; G02B 27/4222; G02B 27/01; G02B 27/0101; G02B 27/0103; G02B 27/0172; G02B 2027/0123; G02B 2027/0105; G02B 2027/0107; G02B 2027/011; G02B 2027/0116; G02B 2027/0118; G02B 2027/0125; G02B 2027/0174; G02B 2027/0127;  
(Continued)

(56) References Cited

U.S. PATENT DOCUMENTS 9,741,563 B2 8/2017 Xiang et al.  
2015/0178939 A1* 6/2015 Bradski ................. G06T 19/006  
345/633

(Continued)

FOREIGN PATENT DOCUMENTS

JP 2013077665 4/2013

OTHER PUBLICATIONS

Nouri et al., "Silicon Anodization As a New Way to Transfer 3D Nano-Imprinted Pattern into a Substrate," ECS Transactions, 77 (4), 119-124, 2017, 7 pages.

(Continued)

*Primary Examiner* — Marin Pichler  
(74) *Attorney, Agent, or Firm* — Hanley, Flight & Zimmerman, LLC

(57) ABSTRACT

Diffractive optical elements for wide field-of-view virtual reality devices and methods of manufacturing the same are disclosed. An example apparatus includes a substrate and a thin film stack including alternating layers of a first material and a second material. The thin film stack defines an annular protrusion. The annular protrusion has a stair-like profile. Top surfaces of separate ones of steps in the stair-like profile correspond to top surfaces of separate ones of the layers of the second material.

22 Claims, 12 Drawing Sheets

(51) Int. Cl.
  *H01L 21/02*      (2006.01)
  *H01L 21/762*    (2006.01)
  *H01L 27/01*     (2006.01)
  *G06T 19/00*     (2011.01)

(52) U.S. Cl.
  CPC ...... *H01L 21/02507* (2013.01); *H01L 21/762* (2013.01); *H01L 27/016* (2013.01); *G02B 2027/0123* (2013.01); *G02B 2027/0127* (2013.01)

(58) Field of Classification Search
  CPC ........ G02B 1/002; G02B 1/005; G02B 1/007; G06T 19/006; H01L 27/016; H01L 21/762; H01L 21/02507
  USPC ................ 359/558, 566, 569, 573, 575, 576
  See application file for complete search history.

(56) References Cited

U.S. PATENT DOCUMENTS

| | | | |
|---|---|---|---|
| 2017/0085212 A1* | 3/2017 | Shaner | .................. H02S 10/30 |
| 2017/0131460 A1* | 5/2017 | Lin | ..................... G02B 6/0065 |
| 2018/0001582 A1 | 1/2018 | Posseme et al. | |

OTHER PUBLICATIONS

Choi et al., "Scalable fabrication of flexible multi-level nanoimprinting molds with uniform heights via 'top-to-bottom' level patterning sequence," Applied Surface Science 428 (2018) 895-899, Sep. 21, 2017, 5 pages.

Lan et al., "Nanoimprint Lithography," retrieved from [www.intechopen.com], Feb. 2010, 39 pages.

\* cited by examiner

DIFFRACTIVE OPTICAL ELEMENTS FOR WIDE FIELD-OF-VIEW VIRTUAL REALITY DEVICES AND METHODS OF MANUFACTURING THE SAME

FIELD OF THE DISCLOSURE

This disclosure relates generally to virtual reality devices, and, more particularly, to diffractive optical elements for wide field-of-view virtual reality devices and methods of manufacturing the same.

BACKGROUND

Virtual reality (VR) systems enable users to have immersive experiences in which the users have the perception of being present in a virtual environment rather than merely viewing the virtual environment on a screen.

Figure 1:
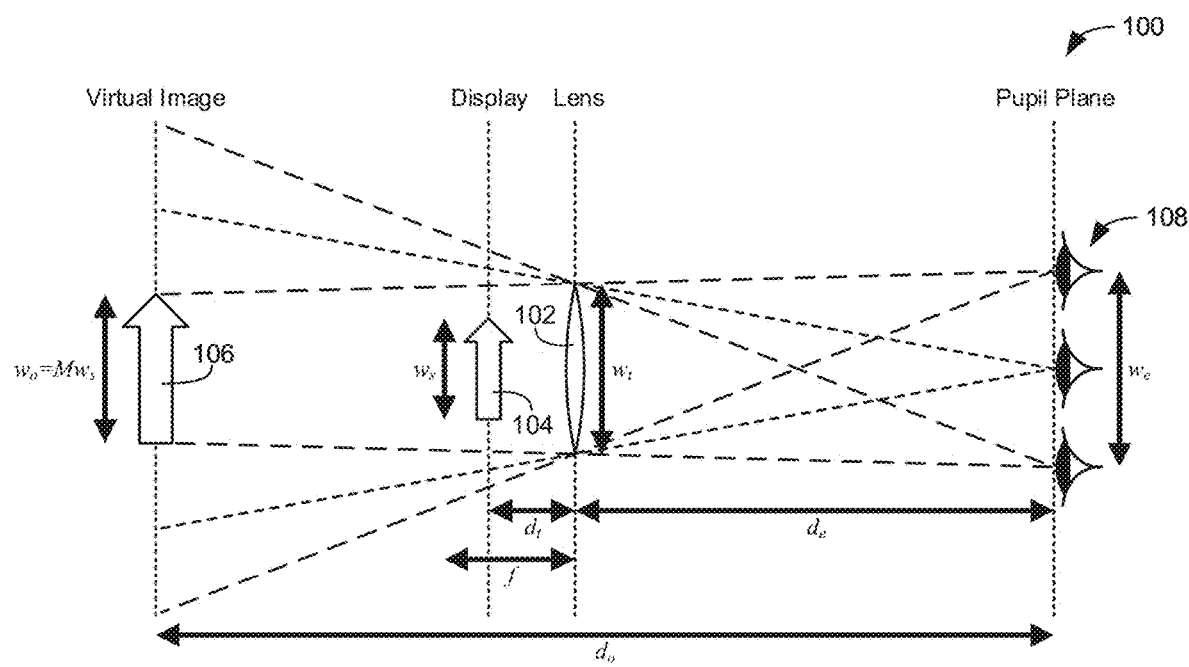
FIG. 1 is a schematic illustration of an example VR display system that implements a simple magnifier that may be used to describe the theory behind VR devices.

The figures are not to scale. Instead, the thickness of the layers or regions may be enlarged in the drawings. In general, the same reference numbers will be used throughout the drawing(s) and accompanying written description to refer to the same or like parts. As used in this patent, stating that any part (e.g., a layer, film, area, region, or plate) is in any way on (e.g., positioned on, located on, disposed on, or formed on, on top of, on the top surface of, etc.) another part, indicates that the referenced part is either in contact with the other part, or that the referenced part is above the other part with one or more intermediate part(s) located therebetween. Stating that any part is in contact with another part means that there is no intermediate part between the two parts. Although the figures show layers and regions with clean lines and boundaries, some or all of these lines and/or boundaries may be idealized. In reality, the boundaries and/or lines may be unobservable, blended, and/or irregular.

DETAILED DESCRIPTION

Some virtually reality (VR) devices (e.g., head mounted displays (HMDs)) include displays using micro organic light-emitting diode (micro OLED) technology. Such displays are often manufactured on a CMOS (complementary metal-oxide-semiconductor) backplane using a monolithic deposition method of organic LED devices on top of CMOS circuits formed on a semiconductor wafer. Micro OLED displays are often combined with relatively thick conventional optics (e.g., lenses) in VR devices to enable a user of such devices to view an output of the display and provide the user with an immersive VR experience.

One factor that contributes to an immersive VR experience is the size of the field-of-view (FOV) of the VR device. The FOV of a VR device describes how extensive an image appears to a user, measured in degrees as observed by one eye (for a monocular VR device) or both eyes (for a binocular VR device). The human visual system (for persons including two operating eyes) has a total binocular FOV of approximately 200° in the horizontal direction by approximately 130° in the vertical direction. As a general matter, the greater proportion of a human's FOV filled by a display image of the device, the more immersive the VR experience. Thus, it is generally desirable to provide a VR device with a wide FOV. However, technological considerations have prevented VR devices from having a FOV sufficient to provide images that are at least as wide as the full FOV of a human.

As used herein, a wide FOV for a VR device is defined to be at least 80°. Achieving a wide FOV often involves the manufacture of large displays having a diagonal length (e.g., top right corner to bottom left corner, or bottom right corner to top left corner) of approximately 2.5 inches. Achieving FOVs of at least 1000 involve a display having a diagonal length of approximately 3 inches or more. Manufacturing displays of such a size using known monolithic fabrication techniques can be cost prohibitive. As such, known VR devices using micro OLED displays are limited to FOVs of approximately 70° or less.

Wide FOVs with smaller displays may be achieved by using thicker lenses. However, thicker lenses increase the total thickness and weight of VR devices, thereby making such devices cumbersome and/or less desirable to end users. Thus, there is a need to manufacture VR devices in a cost-effective manner that provide a wide FOV while being thin and light weight for practical use.

Employing flat or thin lenses in a VR device may reduce the overall thickness and weight of the VR device. Thin lenses may be fabricated by first making a master mask using electron beam lithography. The master mask may then be used to imprint the structure into a substrate. While this approach may produce thin lenses with the desired properties for thinner and lighter VR devices with relatively wide FOVs, the processing involved to fabricate such lenses is cost prohibitive.

Examples disclosed herein address the above challenges by using thin non-conventional optics (e.g., diffractive optical elements (DOEs)) rather than bulkier, conventional refractive and/or reflective lenses. As used herein, thin non-conventional optics are characterized by a thickness that is of the order of magnitude the wavelength of visible light (e.g., less than 1 micron and around 600 nm). By contrast, conventional optics may be several millimeters thick or more. Example methods to manufacture such DOEs in a cost effective manner are disclosed herein.

VR devices, such as head mounted displays, are structured to enable the human eye to focus on objects (e.g., a displayed image) placed in close proximity to the eye. Many approaches to achieve this result can be modelled by the behavior of a simple magnifier in which a miniaturized display is enlarged and made to appear at a distance within the viewer's natural accommodation range (e.g., range where focusing is possible). FIG. 1 is a schematic illustration of an example VR display system 100 that implements a simple magnifier to illustrate the theory behind VR devices. In the illustrated example, the VR display system 100 includes a single converging lens 102 with a focal length f and a width $w_l$. The lens 102 is placed a distance $d_l$ (where $0<d_l \le f$) in front of a microdisplay 104 having a width $w_s$. The lens separation $d_l$ between the lens 102 and the microdisplay 104 is found by applying the Gaussian thin lens formula, as follows:

$$\frac{1}{d_l} = \frac{1}{f} + \frac{1}{d_o - d_e} \quad (1)$$

where $d_o$ is the distance of a virtual, erect image 106 produced by the lens 102 from the location of a viewer's eye 108, and $d_e$ is the eye relief or distance from the lens 102 to the viewer's eye 108.

As shown in FIG. 1, the lens 102 acts as a simple magnifier to produce the virtual image 106 of the microdisplay 104 with an enlarged width $w_o$ relative to the width $w_s$ of the microdisplay 104. In some examples, the virtual image distance $d_o \ge 0$ between the eye 108 of the viewer and the virtual image 106 is a design specification that ensures comfortable accommodation (i.e., focusing) by the viewer. Based on the arrangement shown in FIG. 1, the microdisplay 104 appears magnified by a factor of M, given by $$M = \frac{w_o}{w_s} = \frac{d_o - d_e}{d_l} = 1 + \left(\frac{d_o - d_e}{f}\right) \quad (2)$$

The field-of-view (FOV) $\alpha$ of the VR display system 100 is defined as the angle subtended by the visible portion of the virtual image 106, as observed from the viewer's perspective. The FOV can be quantified by the following expression:

$$\alpha = 2 \tan^{-1}\left[\min\left(\frac{w_l}{2d_e}, \frac{Mw_s}{2d_o}\right)\right] \quad (3)$$

The spatial resolution $N_p$ is defined as the number of (magnified) pixels appearing to span the FOV, and is given by $$N_p \equiv \frac{2d_o \tan(\alpha/2)}{pM} = \min\left(\frac{d_o w_l}{d_e M p}, \frac{w_s}{p}\right) \quad (4)$$

where p is the pixel pitch of the display 104 (e.g., the distance between the center of one pixel of the display 104 to the center of an adjacent pixel).

Viewers will see the full extent of the virtual image 106 if their pupil is located within an eye box (i.e., an imaginary volume) oriented parallel to the display surface and spaced from the lens 102 by a distance of the eye relief $d_e$. The following expression quantifies the maximum-allowable eye box width $w_e$:

$$w_e = \left|\left(\frac{d_o}{d_o - d_e}\right)w_l - \left(\frac{1}{f} + \frac{1}{d_o - d_e}\right)d_e w_s\right| \quad (5)$$

Equations (3), (4), and (5) can be used to assess the two-dimensional design trade space for the example VR display system 100, parameterized by the lens focal length f and the lens width $w_l$.

In some examples, to maintain a quality image, the VR display system 100 is structured to produce the virtual image 106 at full resolution. Full resolution is defined to be when the spatial resolution $N_p$ equals the ratio of the virtual image width $w_s$ to the pixel pitch p of the display (i.e., $N_p = w_s/p$). To achieve full resolution, the following condition must be satisfied:

$$w_s \le \frac{d_o}{d_e} \frac{1}{M} w_l \quad (6)$$

which can be expressed as $$w_l \ge \left(1 + \left(\frac{d_o - d_e}{f}\right)\right)\left(\frac{d_e}{d_o}\right)w_s \quad (7)$$

Based on the condition of Equations (6) and (7), the FOV ($\alpha$) expressed in Equation 3 may be given as $$\alpha = 2 \tan^{-1}\left[\frac{Mw_s}{2d_o}\right] \quad (8)$$

Substituting Equation (2) into Equation (8) results in the following expression for the FOV:

$$\alpha = 2 \tan^{-1}\left[\frac{w_s}{2d_o}\left(1 + \left(\frac{d_o - d_e}{f}\right)\right)\right] \quad (9)$$

The numerical aperture NA for the lens 102 is given by $$NA = \sin\left(\tan^{-1}\left[\frac{w_l}{2f}\right]\right) \quad (10)$$

Figure 2:
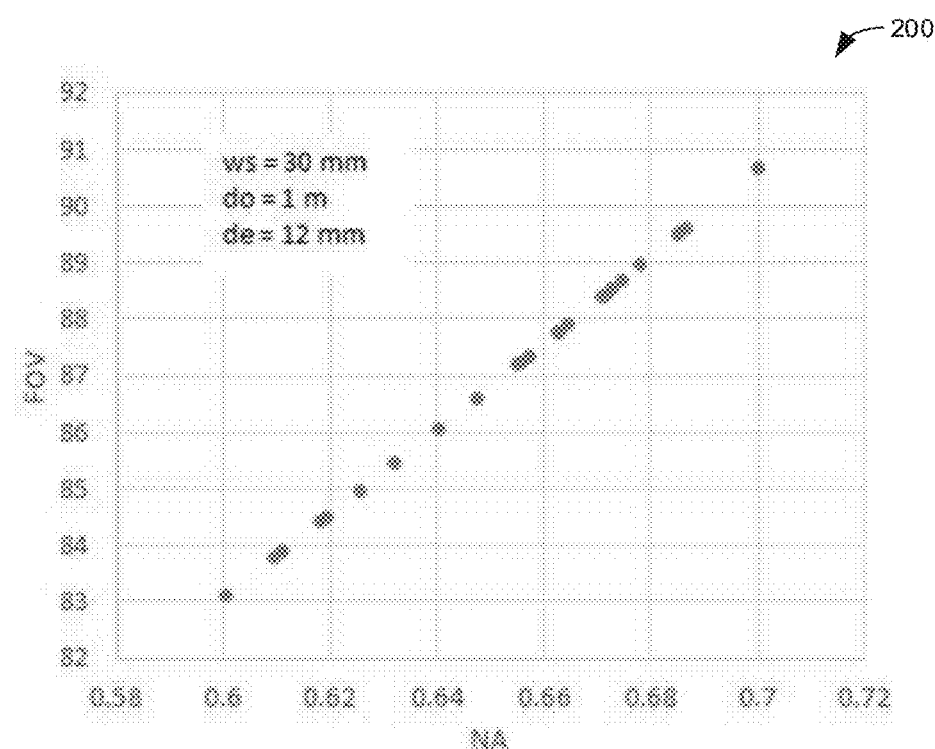
FIG. 2 is a graph showing calculated relationships between the field-of-view and the numerical aperture of a lens.

The calculated relationship between the FOV and the numerical aperture NA for a given display size (width $w_s$), virtual image distance $d_o$, and eye relief $d_e$ is shown in graph 200 of FIG. 2. In particular, in the illustrated example, the display width $w_s$ is 30 mm, with a virtual image distance $d_o$ set to 1 m, and an eye relief $d_e$ of 12 mm. As shown in FIG. 2, based on these parameters, a FOV of 83° is achieved by the lens 102 having a numerical aperture NA of approximately 0.6. If the lens 102 is manufactured with a numerical aperture NA of approximately 0.7, a FOV that is greater than 90° may be achieved. Thus, larger FOVs are possible as the numerical aperture of the lens 102 increases.

Conventional optical elements involve lenses and mirrors to redirect or otherwise manipulate light. The behavior of conventional lenses is governed by the law of refraction (Snell's law) and are limited in the numerical apertures that can be achieved. Unlike such conventional lenses, diffractive optical elements (DOEs) are based on binary optics and introduce a diffractive element with a behavior governed by the grating equation. The name "binary optics" is traced to the computer-aided design and fabrication of these elements. A computer defines a stepped (or binary) microstructure which acts as a specialized diffractive structure or grating. By varying the shape and pattern of the diffractive structure, the optical properties of the DOE can be adapted to a wide range of applications such as lenses. Thus, DOEs can be specifically designed with high numerical apertures that may be used to produce VR devices with wide FOVs. Indeed, it is theoretically possible to design DOEs with numerical apertures at or close to 1.0, which would enable FOVs of greater than 110°. Fabricating DOEs with high numerical apertures involves producing very small features structures. As the size of the individual features approach the order of the wavelength of incident light, the lens will act more like a binary lens and the efficiency of the lens will decrease. Thus, while a numerical aperture of 1.0 is theoretically possible, there are practical limitations that limit the uses or applications of such lenses. In some examples, numerical apertures of at least 0.7 can be implemented without significant difficult. It is expected that even higher numerical apertures (e.g., 0.8, 0.85, 0.9, etc.) may also be practically implemented.

DOEs are computer generated synthetic lenses that are very flat and thin (e.g., a thickness ranging from approximately 0.600 nm to 1000 nm (1 µm)). More particularly, the total thickness of a diffractive lens corresponds to the free-space operating wavelength divided by the difference in refractive index between the lens material and the surrounding material ($\lambda_0/\Delta n$). Thus, assuming 600 nm light is passing through a lens made of a material with a refractive index of 1.5 surrounded by air (e.g., a refractive index of 1.0), the thickness of the diffractive lens will be approximately 1200 nm.

Example DOEs disclosed herein and structured to include a pattern of fringes, ridges, or protrusions having a stair-like profile or configuration with feature sizes less than 300 nm. In this context, "feature size" refers to the size of an individual step in the stair-like profile of different ones of the protrusions of a DOE. Unlike conventional refractive or reflective optics (e.g. lenses), DOEs do not suffer from conventional image aberrations because DOEs perform diffraction limited imaging.

Figure 3:
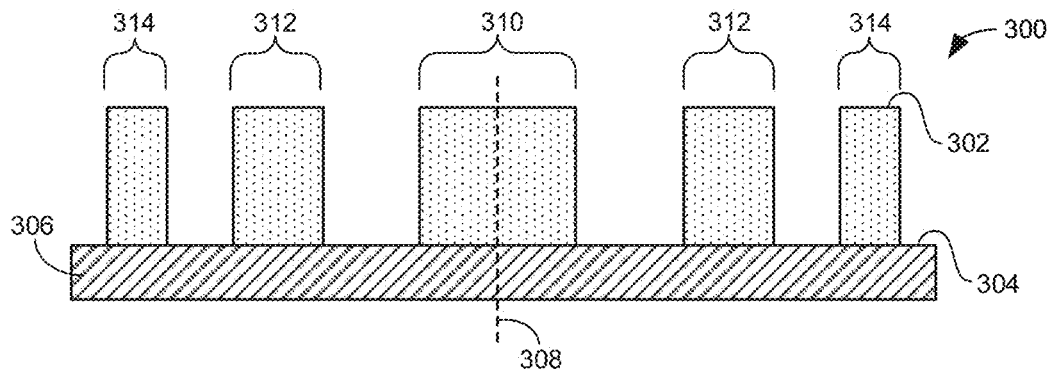
FIG. 3 is a cross-sectional profile of an example binary diffractive optical element (DOE).
Figure 4:
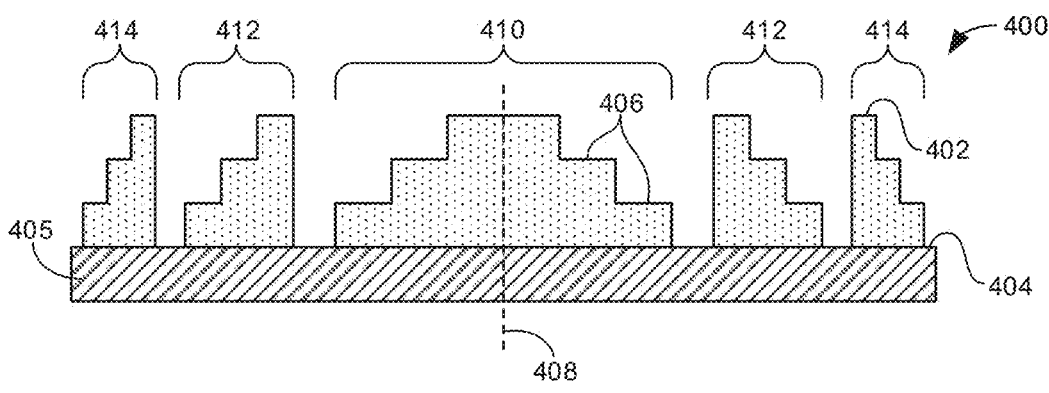
FIG. 4 is a cross-sectional profile of an example quaternary DOE.
Figure 5:
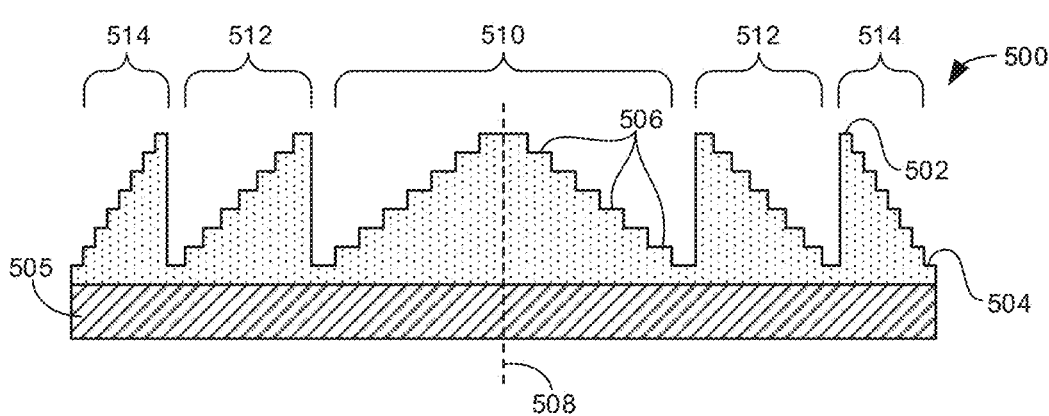
FIG. 5 is a cross-sectional profile of an example octonary DOE.

FIGS. 3-5 are cross-sectional profiles of example diffractive lenses (e.g., diffractive optical elements (DOEs) constructed based on binary optics. FIG. 3 corresponds to a binary DOE 300 with two levels of planar surfaces, including a top surface 302 and a base or bottom surface 304 (corresponding to the top surface of the underlying substrate 306 in FIG. 3). FIG. 4 corresponds to a quaternary DOE 400 with four levels of planar surfaces in a stepped formation including a top surface 402, a bottom surface 404, and two intermediate surfaces 406. FIG. 5 corresponds to an octonary DOE 500 with eight levels of planar surfaces in a stepped formation including a top surface 502, a bottom surface 504, and six intermediate surfaces 506. As shown, by way of comparison, the bottom surface 504 of the octonary DOE 500 is spaced apart from the underlying substrate 505 whereas the bottom surface 304, 404 of FIGS. 3 and 4 correspond to the top surface of the corresponding substrates 306, 405.

Figure 3A:
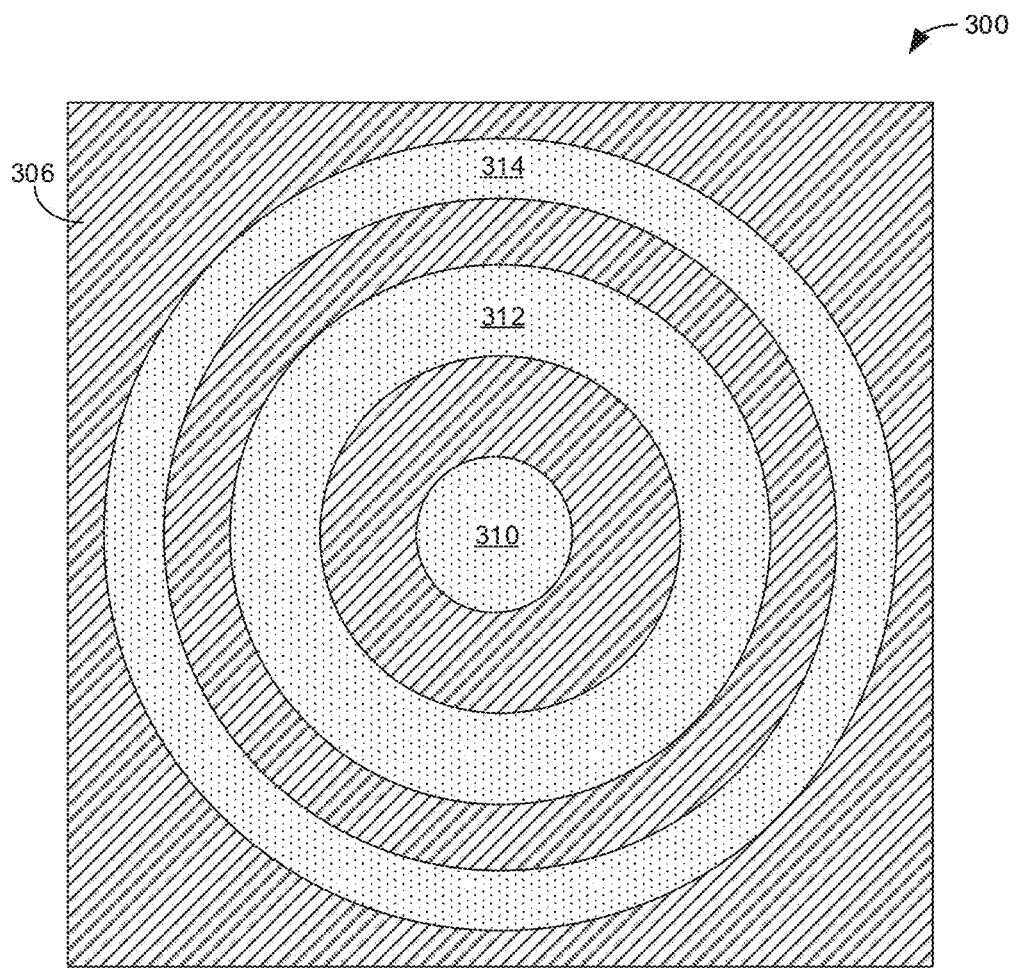
FIG. 3A is a top view of the example binary DOE of FIG. 3.

In the illustrated examples, the stepped formations of the example DOEs 300, 400, 500 are generally circular about a central axis 308, 408, 508 such that the same cross-sectional profile results regardless of the angle of rotation. In more detail, a central protrusion 310 of FIG. 3 is a circular column as shown by the top view of the DOE 300 in FIG. 3A. The protrusions 312 shown on either side of the central protrusion 310 in FIG. 3 correspond to a single annular ring surrounding the column of the central protrusion 310 as shown in FIG. 3A. The outer protrusions 314 of the example profile in FIG. 3 correspond to a second annular ring as shown in FIG. 3A. While a central protrusion 310 with two annular protrusions 312, 314 are shown in FIGS. 3 and 3A for purposes of illustration, diffractive lenses may include many annular protrusions (e.g., numbering in the thousands). The example DOEs 400, 500 of FIGS. 4 and 5 are similarly constructed with a central protrusion 410, 510 and a plurality of annular protrusions 412, 414, 512, 514 surrounding the central protrusion 410, 510. However, unlike the DOE 300 of FIG. 3, the central protrusion and annular protrusions of the DOEs 400, 500 of FIGS. 4 and 5 include individual stepped profiles. Put another way, the protrusions in FIG. 3 include a single step whereas the protrusions in FIGS. 4 and 5 include multiple steps. That is, as used herein, a protrusion is defined as a structure on a DOE that extends upward from a base or bottom surface 304, 404, 504 and may include one or more steps. Thus, a protrusion is distinct from a step, as used herein, in that a protrusion is demarcated on either side of its cross-section by a region on the DOE that extends to the bottom surface 304, 404, 504. By contrast, a step, as define herein, is a structure defined by an upper surface substantially parallel with a plane of the DOE (e.g., substantially horizontal when the DOE is laying horizontal) and a side surface that is substantially perpendicular to the plane of the DOE (e.g., substantially vertical when the DOE is laying horizontal).

In some examples, each individual step has the same height (e.g., the distance from the top surface 402 to the highest immediately adjacent intermediate surface 406 in FIG. 4 is the same as every other step), because inconsistencies in the step height can deleteriously impact the quality of the lens. As such, the height of any particular step is a function of (a) the total height of the lens (e.g., the distance between the bottom surface 304, 404, 504 and the top surface 302, 402, 502) and (b) the total number of steps between the top and bottom surfaces. Thus, for a lens that is 500 nm thick and includes 16 stepped faces, the height of each step is approximately 500 nm/15=33 nm. The total thickness is divided by one less than the number of stepped surfaces in the example because the number of stepped surfaces is inclusive of both the top and bottom surfaces. By contrast, a 3 am thick lens with 4 stepped surfaces would result in individual step heights of approximately 3 µm/3=1 µm. As described further below, examples disclosed herein achieve step heights within precise tolerances (e.g., within +/−5 nm or less (e.g., from 1 nm to 3 nm)) for improved performance using fabrication techniques exhibiting substantially reduced costs compared to conventional techniques that have been used in the past to produce DOEs. In some examples, each step alters that phase of an incoming wave of light by a fraction of $2\pi$. The total height of all steps (e.g., the full thickness of a DOE) is sufficient to alter the phase of incoming light between zero and $2\pi$ (e.g., spatially corresponding to one full wavelength). As mentioned above, the total thickness of a DOE corresponding to the sum of the height of each of the individual steps. The phase accumulation for a given DOE corresponds to the sum of the phase altered by each of the steps.

As shown in the illustrated examples, the width (e.g., the distance in the plane of the lens) of the central protrusion and annular protrusions (and the associated steps) may vary based on the distance from the central axis 308, 408, 508 of the DOEs 300, 400, 500. The width of the central and annular protrusions and the width of the associated steps are dimensions that may be adjusted during the design process to tune the focusing behavior of the different regions of the respective DOEs 300, 400, 500. As with the height of each step, the width of the steps associated with any particular protrusion are designed to be consistent with the other steps associated with the same particular protrusion. The width of steps may be any suitable dimension within practical limitations. For example, steps may range from approximately 1 μm wide to as narrow as approximately 50 nm wide. In general, the step width is closer to the lower end of this range for protrusions spaced radially further from the central axis of a lens and/or for protrusions that include a greater number of stepped surfaces. Example fabrication methods disclosed herein are able to control the width of individual steps with precise tolerances (e.g., within +/−5 nm or less (e.g., from 1 nm to 3 nm)).

As mentioned above, the example DOEs 300, 400, 500 of FIGS. 3-5 include different numbers of planar surfaces corresponding to the steps of the circular protrusions. The greater the number of levels or steps in each of the protrusions of the structure, the higher the optical efficiency of the lens. As used herein, the "optical efficiency" or simply "efficiency" of a lens refers to the percentage of light that passes through the lens without being absorbed, reflected, or otherwise lost. For example, a binary lens (FIG. 3) has an efficiency of approximately 40%, a quaternary lens (FIG. 4) has an efficiency of approximately 83%, and an octonary lens (FIG. 5) has an efficiency of approximately 95%. The ability to produce arbitrary phase profiles for different protrusions (e.g., any number of steps having any suitable dimension) allows for an additional degree of freedom in designing optical systems. Theoretically, on-axis diffractive phase elements (e.g., the steps formed on the separate protrusions) can achieve 100% diffraction efficiency. However, to achieve this efficiency, as many as 16 levels or stepped surface in the phase profile may be necessary. While greater efficiency is achieved with multilevel relief structures, the increased number of steps typically results in increased difficulty and cost in fabricating such devices because of the more complex structure formed with features of a smaller size. However, example methods disclosed herein facilitate the manufacture of complex DOEs at relatively little cost compared with conventional fabrication processes used in the past for DOEs.

Important parameters in the design and fabrication of planar DOEs such as Fresnel lenses are the lateral size of the smallest realizable segment (e.g., width of an individual step (e.g., the width of the intermediate surfaces 406, 506 of FIGS. 4 and 5)), the maximum relief height (e.g., total thickness of the lens (e.g., the distance between the top surfaces 302, 402, 502 and the bottom surfaces 304, 404, 504 shown in FIGS. 3-5)), and the steepness of the relief step. These parameters control the maximum lens numerical aperture (NA) attainable for a DOE. Inconsistencies or errors in the design and/or fabrication of DOEs can have a deleterious impact on the quality of the DOEs. Therefore, fabrication processes for DOEs require high precision. Achieving such precession has been made difficult in the past by the fact that conventional approaches to manufacture planar DOEs involve multiple photo-lithographic processes. By way of illustration, using traditional techniques a desired pattern for a DOE is plotted in a chrome coating or a quartz substrate by an electron beam writer to produce an amplitude master mask. The mask is replicated in a photoresist layer that coats the substrate using ultraviolet (UV) illumination of the unmasked photoresists areas in a vacuum contact copying process. Chemical development of the exposed photoresist reveals a surface profile formed of either the unexposed photoresist or the bare substrate material (e.g., where the exposed photoresist was removed). The resulting surface profile is transferred to the substrate by reactive-ion etching (RIE) to a specified depth. RIE is a process in which an RF electric field excites a gas to produce ions. The produced ions react with the material of the substrate and etch away the surface at a controlled rate. The reactive ion etching process is anisotropic so that the vertical side walls of the discrete phase profile are retained (i.e., not etched away).

The process described above results in a binary lens profile with two planar surfaces, levels, or phase steps. Forming a structure with additional levels or steps involves repeating the entire process multiple times. Depending on the design of subsequent masks, the second iteration of the process can produce a quaternary lens profile with four planar surfaces, and the third iteration of the process can produce an octonary lens profile. Further iterations would produce additional phase steps or levels. The maximum number of phase steps $Z_{max}$ is given by $$Z_{max} = \frac{\lambda}{(n-1)R} \quad (11)$$

where λ is the wavelength of light, n is the refractive index of the lens material, and R is the etch depth resolution of the fabrication equipment.

There are a number challenges in the known iterative process described above that can lead to imperfections in the fabrication of DOEs. For precise fabrication, the masking in each subsequent iteration needs to be precisely aligned with the structure produced by the previous iteration(s). An incorrect alignment of the masking layers for a multi-level DOE negatively impacts both diffraction efficiency and signal error. The required degree of misalignment necessary to introduce a significant error is small (e.g., less than 25 nm). While alignment concerns may be alleviated by using different fabrication techniques (e.g., using direct laser lithography, direct electron-beam lithography, or grey-scale micro-lithography (or photo-sculpting)), such techniques are typically cost prohibitive due to slow throughput.

Another challenge of the convention photo-lithography process for DOEs described above is controlling the depth of the etching processes. An incorrect etch depth will alter the phase profile of the DOE effectively producing a 'weaker' grating as seen by the incident wavefront. In order to maintain a uniformity error of less than 10% in 16 level DOEs in fused silica for a wavelength of 633 nm (red color), a final etch depth accuracy (after repeating all etch fabrication cycles) of approximately 12 nm is required. To achieve such accuracy for the final etch depth, the depth accuracy for each etching process needs to be less than 5 nm, which is very challenging using current etching techniques that involve monolithic DOE designs.

Errors in the steepness of the relief step can also deleteriously affect the performance of a DOE. Specifically, the scattering intensity in a discontinuous surface has been found to be significantly higher than a continuous surface. As a result, the steepness of the relief steps is important to achieving diffraction efficiency.

Unlike the fabrication of monolithic lenses following the above approach, example DOEs (diffractive lenses) disclosed herein are manufactured using a manufacturing technique disclosed herein that employs a stack of thin films made of different materials with different etch selectivities. The etching of the stack of thin films is controlled using two binary amplitude masks to fabricate the multi-level phase information. The masks may be structured to provide any suitable number of phase steps (e.g., 2, 3, 4, 8, 10, 16, or more). In some examples, the masks are made using UV (e.g., deep UV) lithography. In some examples, etching is accomplished using any suitable dry etching technique such as, for example, RIE or ion bombardment.

Example etching processes disclosed herein are similar to the conventional process outlined above in that the example process includes coating the optical element substrate with a photoresist, exposing the photoresist through masks, developing the photoresist, and then etching the substrate. However, unlike the iterative process described above, examples disclosed herein apply the photoresist once and repeatedly trim the photoresist down to a smaller size between different etching processes. The trimmed photoresist serves as an etching mask layer for each etching process to transfer structures onto the film stack. Because the same photoresist is used for every etching process, unlike the conventional approach, there is no need to align a new mask for each new etching process. That is, the alignment steps required in conventional manufacturing processes for DOEs are completely eliminated thereby eliminating the possibility of alignment errors explained above. Thus, the successive etching processes are performed without an intermediate alignment process. Rather, a simple photoresist trimming process is performed between different etching procedures.

Additionally, successive etching processes etch through a single layer in the film stack with the layer immediately below serving as a physical barrier or etch stop based on the difference in etch selectivity of the materials in the two layers (i.e., the rate at which the materials are etched away). In this manner, the etch depth can be precisely controlled to the thickness of the layers in the film stack without concern of over-etching, unlike the conventional approach. By alternating between etching through the layers in the film stack and trimming the photoresist, stair-like structures, such as those shown in FIGS. 3-5, may be formed. In some examples, the resulting structure is used as a diffractive lens (e.g., a DOE) for a VR device. In other examples, the resulting structure may serve as a mold or master mask used in nanoimprint lithography to make diffractive lenses (e.g., DOEs). Additional detail is provided in connection with FIGS. 6-26.

Figure 6:
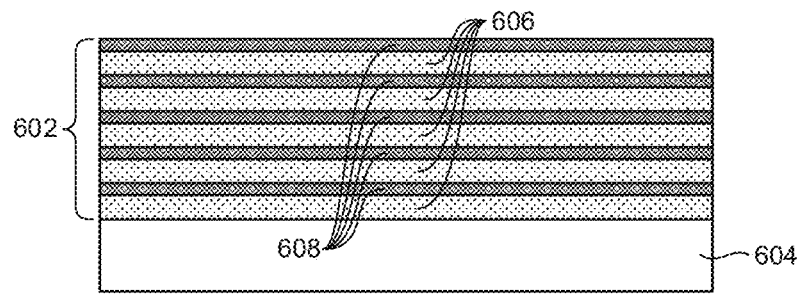
FIGS. 6-22 illustrate example stages in the fabrication process of a stair-like structure for an example DOE.

FIGS. 6-22 illustrate example stages in the fabrication process of a stair-like structure for a DOE. FIG. 6 includes a thin film stack 602 formed on a substrate 604. In the illustrated example, the substrate 604 includes a semiconductor material (e.g., silicon (Si), germanium (Ge), gallium arsenide (GaAs), etc.). In some examples, the thin film stack 602 includes alternating layers of two different materials 606, 608 with different etch selectivities. The stack 602 may be formed by alternately depositing the first and second materials 606, 608 on top of one another to form successive ones of the layers using any suitable deposition technique. In some examples, the first material 606 is a dielectric material such as, for example, silicon dioxide ($SiO_2$), silicon nitride ($Si_3N_4$), titanium oxide ($TiO_2$), etc. In the illustrated example, the second material 608 is a conductive material (e.g., includes a metal or a semiconductor). More particularly, in some examples, the conductive material 608 includes ruthenium (Ru). Additionally or alternatively, the conductive material 608 may include other suitable metals such as, for example, one or more of tungsten (W), tungsten silicide (WSi), tungsten polysilicon (W/poly), tungsten alloy, tantalum (Ta), titanium (Ti), copper (Cu), nickel (Ni), cobalt (Co), chromium (Cr), iron (Fe), manganese (Mn), aluminum (Al), hafnium (Hf), vanadium (V), molybdenum (Mo), palladium (Pd), gold (Au), silver (Au), platinum (Pt), alloys thereof, and/or nitride compounds thereof (e.g., titanium nitride (TiN), tantalum nitride (TaN), etc.).

The ordering of the layers is not important. That is, while the dielectric material 606 is shown as being deposited first to be in direct contact with the substrate 604, in other examples, the conductive material 608 may be deposited first to be in direct contact with the substrate 604. As described further below, the thicknesses of the different layers are determined based on the desired height of each step in the stair-like structures to be formed. More particular, in some examples, the combined thickness of one layer of the first material 606 and one layer of the second material 608 corresponds to the desired height for a single step. In other words, a single step may be defined by the distance between the top surfaces of two adjacent layers of the same material (e.g., the top surface of two adjacent layers of the first material 606 or the top surfaces of two adjacent layers of the second material 608). In some examples, the thicknesses of the different layers are substantially equal. In other examples, the layers associated with one of the materials is thicker than the other. For example, the layers of conductive material 608 may have a thickness ranging from 5 nm to 10 nm while the layers of dielectric material 606 may have a thickness ranging from 50 nm to 300 nm. Further, in some examples, the relative thickness of the two layers associated with one step in the desired stair-like structure may be different than the relative thicknesses of the two layers in a different step.

Figure 7:
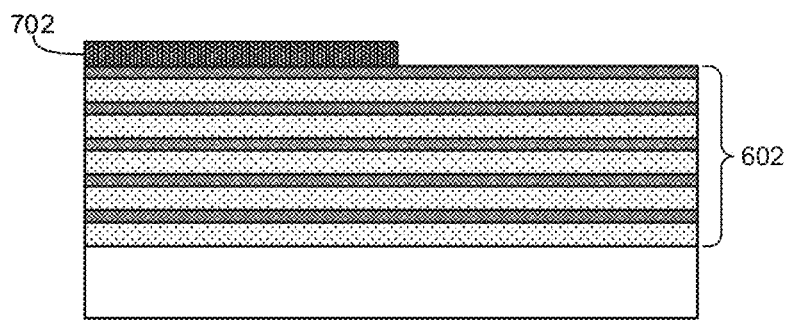
Figure 8:
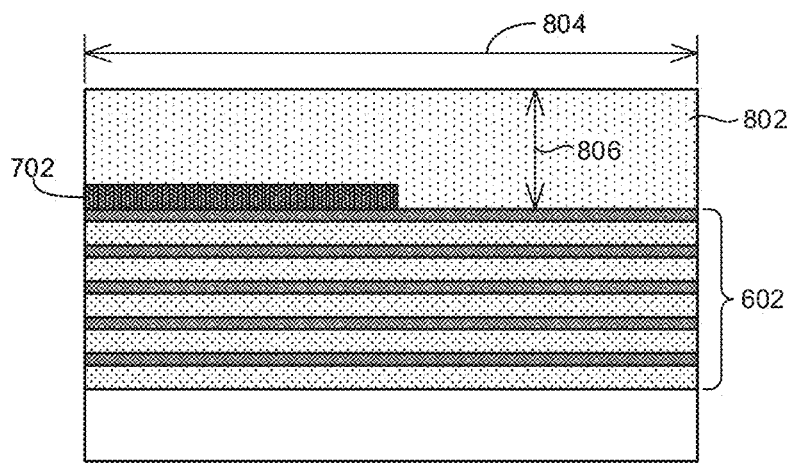

FIG. 7 illustrates the deposition and patterning of a mask film 702 on the top surface of the thin film stack 602. In some examples, the mask film 702 includes, for example, silicon nitride ($Si_3N_4$), aluminum oxide ($Al_2O_3$), titanium oxide ($TiO_2$), etc. FIG. 8 illustrates the deposition of a photoresist 802 on top of the mask film 702 and any exposed portions of the film stack 602. In some examples, the photoresist 802 is applied using a spin coating procedure. The photoresist 802 is formed with an initial lateral dimension 804 selected to be trimmed down during successive stages in the process as described further below. The thickness 806 of the photoresist 802, at the stage of FIG. 8, is greater than the reduction the photoresist 802 will undergo as a result of the multiple trim procedures as well as the etching procedures as described further below.

Figure 9:
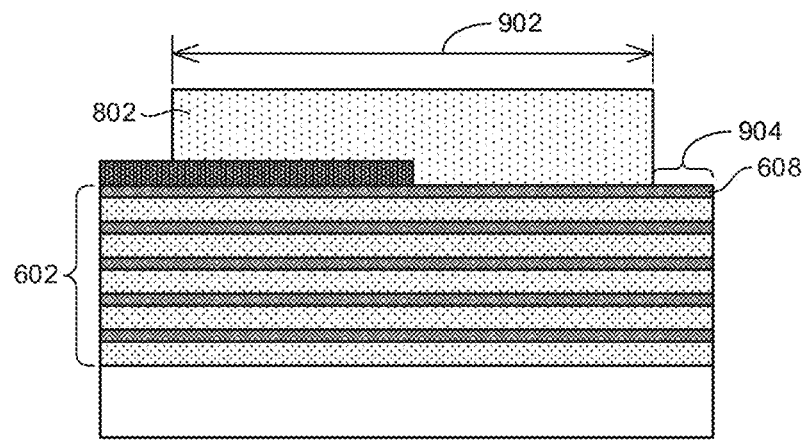

FIG. 9 illustrates the photoresist 802 after undergoing a lateral (horizontal) trimming process. As shown in the illustrated example, the trimming process reduces the initial lateral dimension 804 of the photoresist 802 (FIG. 8) to a second, smaller lateral dimension 902. In some examples, the trimming process is an isotropic trimming process such that the photoresist 802 is reduced in both the vertical and lateral directions. To accommodate the vertical trimming that occurs along with the lateral trimming in such examples, the initial thickness 806 of the photoresist (see FIG. 8) is significantly thicker than the layers within the film stack 602. In the illustrated example, the trimming process involves a trimming gas mixture that has a high selectivity for the photoresist layer over either the dielectric material 606 or the conductive material 608 of the thin film stack 602. As a result, the photoresist 802 will be removed without affecting any exposed portions of the thin film stack 602. In some examples, the trimming gas mixture includes an oxygen containing gas (e.g., $O_2$, NO, $N_2O$, $CO_2$, CO, etc.). In some examples, the oxygen containing gas may be accompanied by a nitrogen containing gas (e.g., $N_2$, NO, $N_2O$, $NH_3$, etc.) and/or an inert gas (e.g., Ar, He, etc.).

As shown in the illustrated example of FIG. 9, the trimming of the photoresist 802 to the second lateral dimension 902 exposes a portion 904 of the top layer of the thin film stack 602. In this example, the exposed portion 904 of the thin film stack 602 is an annular ring (or portion thereof). As shown and described further below, the width of the exposed portion 904 (corresponding to the amount of reduction in the size of the photoresist 802) defines the width of one of the steps in the stair-like structure to be formed in the film stack 602. Thus, the precision with which the trimming process is controlled corresponds to the precision within which the lateral dimension (e.g., the width) of individual steps in a resulting DOE may be fabricated.

Figure 10:
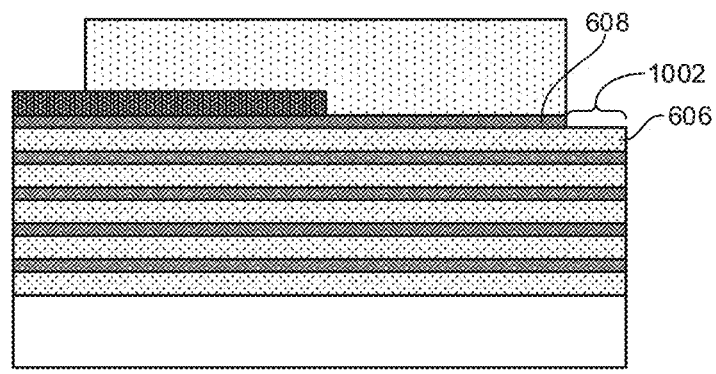

FIG. 10 illustrates the result of a first etching process on the thin film stack 602 in which the exposed portion 904 of the top layer of the conductive material 608 (see FIG. 9) is removed. The first etching process involves a first etching gas mixture that includes an oxygen containing gas (e.g., $O_3$, $O_2$ or $H_2O$, NO, $NO_2$, $N_2O$, CO, $CO_2$, etc.). Such an etching gas mixture is selective to the conductive material 608 over the underlying dielectric material 606. As a result, the dielectric material 606 serves as a barrier or etch stop for the first etching procedure to precisely control the etch depth and prevent over-etching. Thus, as shown in FIG. 10, the first etching process exposes a portion 1002 of the uppermost layer of the dielectric material 606. The width of the exposed portion 1002 corresponds to the amount of reduction in the lateral size of the photoresist 802 because the first etching process is anisotropic and, therefore, substantially limited to removal of the conductive material in the vertical direction. In some examples, the first etching process may result in some removal of the photoresist 802 in the vertical direction. However, as described above, the initial thickness 806 of the photoresist 802 is sufficient to account for such removal of the photoresist 802. In some examples, the thickness of the layers of the conductive material 608 are relatively thin compared to the thickness of the layers of the dielectric material 606 to reduce the impact of the first etching process on the photoresist 802. For instance, in some examples, the thicknesses of the layers of the conductive material 608 are less than 10 nm (e.g., 5 nm) with the layers of the dielectric material being significantly more (e.g., 25 nm, 100 nm, 300 nm, or more) to make up the difference to the desired height for the individual steps in the stair-like structure to be formed.

Figure 11:
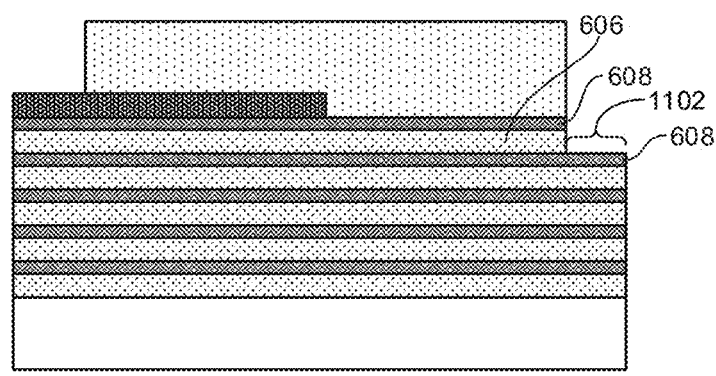

FIG. 11 illustrates the result of a second etching process on the thin film stack 602 by which the exposed portion 1002 of the conductive material 608 (see FIG. 10) is removed. The second etching process involves a second etching gas mixture that includes a fluorine-carbon containing gas (e.g., $C_4F_6$, $C_4F_8$, $CF_4$, $CF_4$, $CHF_3$, $CH_2F_2$, etc.). Such an etching gas mixture is selective to the dielectric material 606 over the conductive material 608. As a result, the conductive material 608 serves as a barrier or etch stop for the second etching procedure to precisely control the etch depth and prevent over-etching. Thus, as shown in FIG. 11, the second etching process exposes a portion 1102 of the underlying layer of the conductive material 608. The width of the exposed portion 1102 corresponds to the amount of reduction in the lateral size of the photoresist 802 (and the width of the etched portion 1002 (see FIG. 10) of the uppermost layer of the conductive material 608) because the second etching process is anisotropic and, therefore, substantially limited to removal of the dielectric material 606 in the vertical direction.

Figure 12:
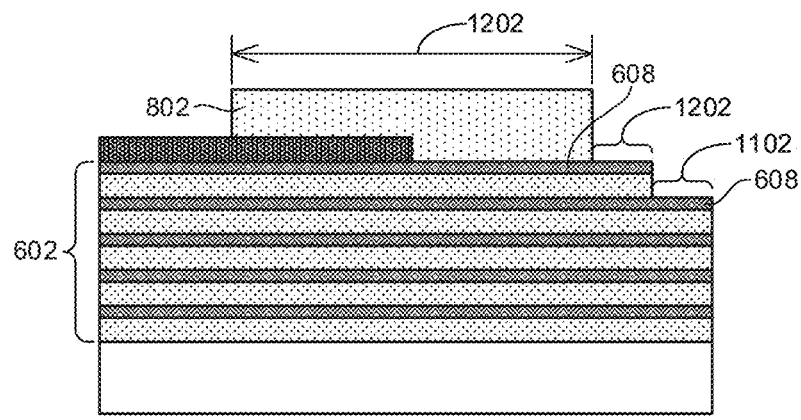

FIG. 12 illustrates the photoresist 802 after undergoing a second trimming process. As shown in the illustrated example, the trimming process reduces the lateral size of the photoresist 802 to a third lateral dimension 1202 smaller than the second lateral dimension 902 shown in FIG. 9. In the illustrated example, the photoresist is also reduced in size in the vertical direction. As a result of the lateral trimming, another portion 1202 of the top layer of the conductive material 608 is exposed (in addition to the exposed portion 1102 of the conductive material 608 in the lower layer of the film stack 602). In some examples, the trimming process is controlled so that the difference between the second dimension 902 and the third dimension 1202 is approximately the same as (e.g., within +/−5 nm or less (e.g., from 1 nm to 3 nm)) the difference between the second lateral dimension 902 and the initial lateral dimension 804. As a result, the exposed portions 1102, 1202 of the top two layers of the conductive material 608 in FIG. 12 have approximately the same width. In this manner, the subsequent etching processes will produce multiple phase steps having substantially the same width.

Figure 13:
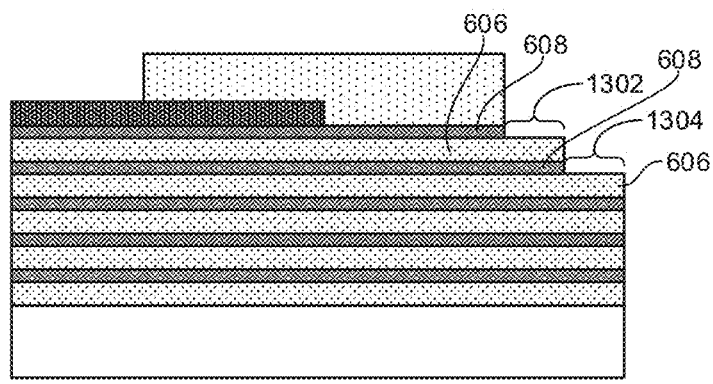
Figure 14:
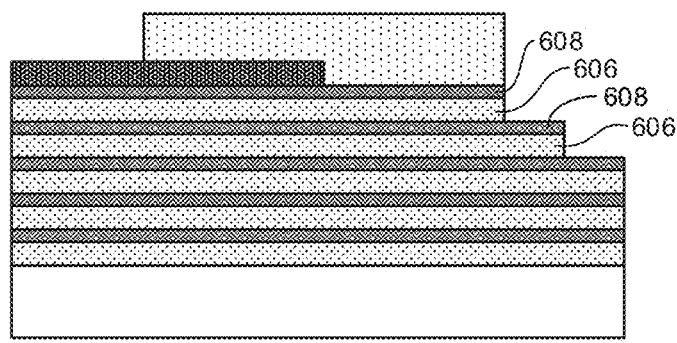

FIG. 13 illustrates the result of repeating the first etching process described above in connection with FIG. 10 by which the exposed portions 1102, 1202 of the conductive material 608 (in the top two layers as shown in FIG. 12) are removed. As described above, the underlying dielectric material 606 serves as a barrier or etch stop to precisely control the depth of the etching process. FIG. 14 illustrates the result of repeating the second etching process described above in connection with FIG. 11 by which the exposed portions 1304 (see FIG. 13) of the dielectric material 606 are removed. As described above, the conductive material 608 underneath the dielectric material 606 serves as a barrier or etch stop to precisely control the depth of the etching process.

Figure 15:
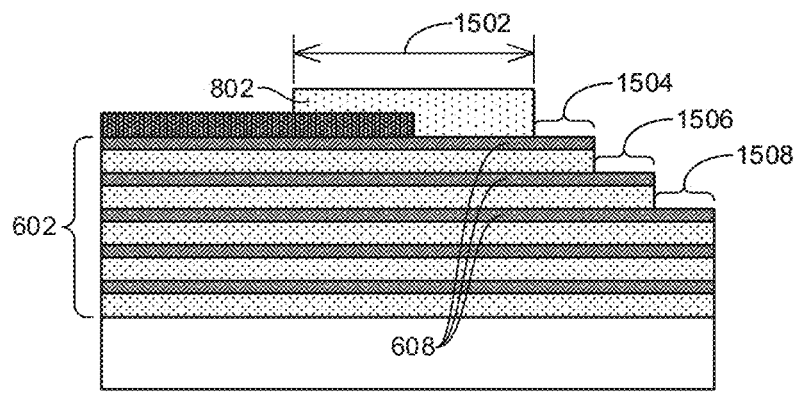
Figure 16:
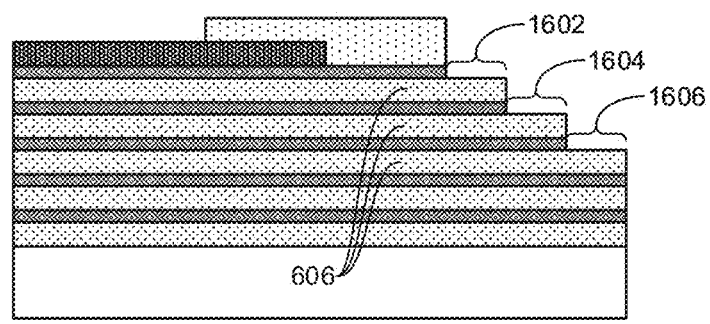
Figure 17:
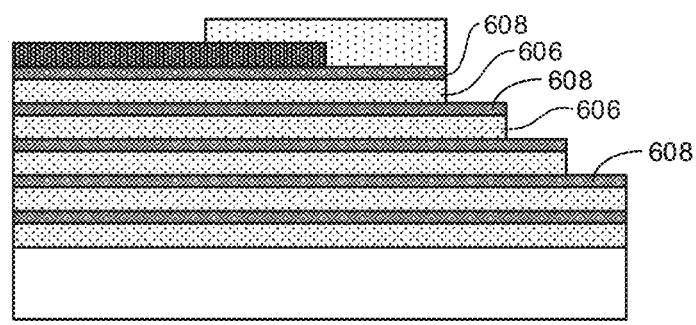

FIGS. 15-17 illustrate another iteration of the processes of FIGS. 9-11. That is, FIG. 15 illustrates the photoresist 802 after undergoing another trimming process. As shown in the illustrated example, the trimming process reduces the lateral size of the photoresist 802 to a fourth lateral dimension 1502 smaller than the third lateral dimension 1202 shown in FIG. 9. In the illustrated example, the vertical size of the photoresist 802 is also reduced. The reduced lateral size of the photoresist 802 exposes another portion 1504 of the top layer of the conductive material 608. As above, the trimming process may be controlled so that the width of the newly exposed portion 1504 of the conductive material 608 is approximately the same as the widths of the exposed portions 1506, 1508 of the lower layers of the conductive material 608. FIG. 16 illustrates the result of repeating the first etching process described above in connection with FIG. 10 to remove the exposed portions 1504, 1506, 1508 of the conductive material 608. FIG. 17 illustrates the result of repeating the second etching process described above in connection with FIG. 11 to remove the exposed portions 1602, 1604, 1606 (see FIG. 16) of the dielectric material 606.

Figure 18:
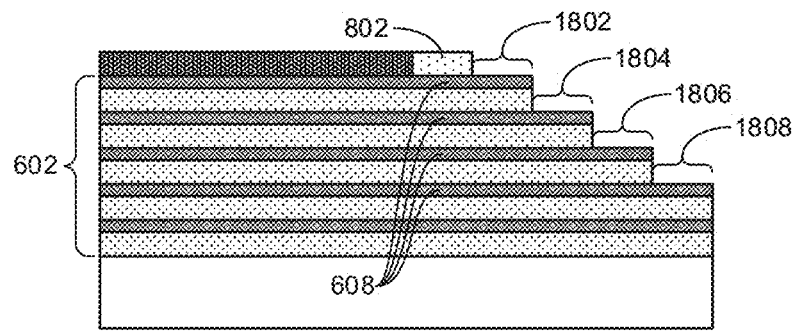
Figure 19:
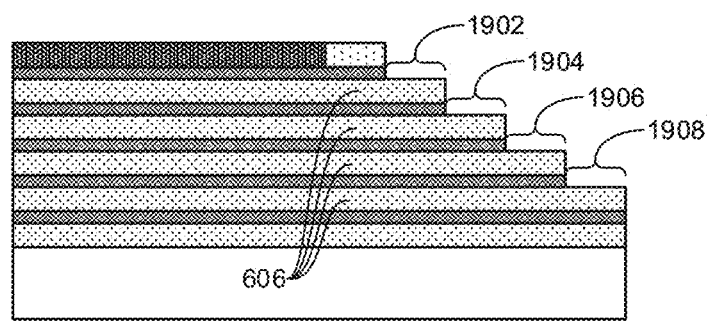
Figure 20:
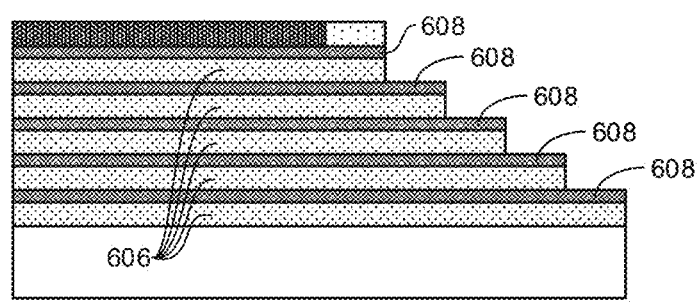

FIGS. 18-20 illustrate another iteration of the processes of FIGS. 9-11. That is, FIG. 18 illustrates the photoresist 802 after undergoing another trimming process to expose another portion 1802 of the top layer of the conductive material 608. FIG. 19 illustrates the result of repeating the first etching process described above in connection with FIG. 10 to remove the exposed portions 1802, 1804, 1806, 1808 (see FIG. 18) of the conductive material 608. FIG. 20 illustrates the result of repeating the second etching process described above in connection with FIG. 11 to remove the exposed portions 1902, 1904, 1906, 1908 (see FIG. 19) of the dielectric material 606.

Figure 21:
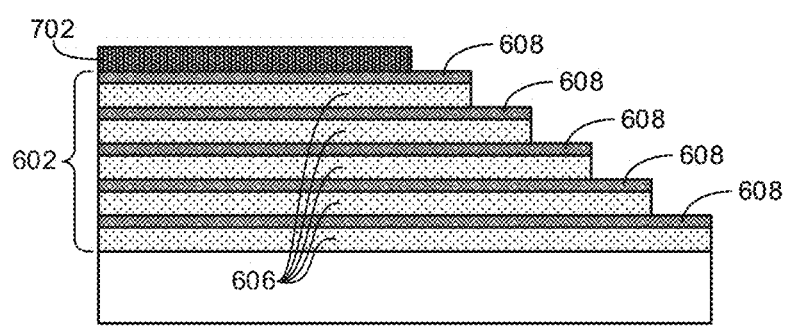

FIG. 21 illustrates the result of removing the remaining portions of the photoresist 802. In some examples, the first and second etching processes may be repeated to create one additional step in the stair-like structure and expose the underlying substrate 604. In such examples, the mask film 702 controls the width of the portion of the top layer of the thin film stack 602 that is removed in a similar manner that the photoresist 802 did during the previous etching processes. In other examples, the bottom layers of the dielectric and conductive materials 606, 608 are not removed.

Figure 22:
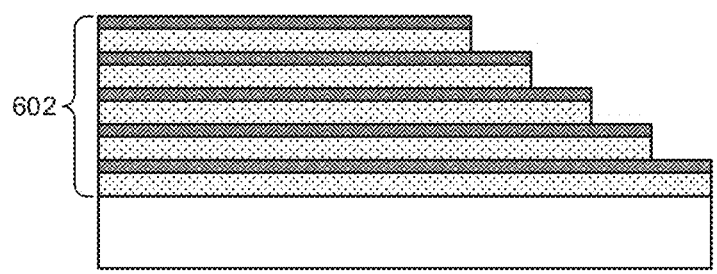

FIG. 22 illustrates the result of removing the mask film 702 and represents the completed stair-like structure with five different planar surfaces, levels, or steps. As shown in the illustrated example, the height of each step corresponds to the combined thickness of one of the layers of dielectric material 606 and one of the layers of conductive material 608. In some examples, the process outlined in FIGS. 6-22 may be repeated for different regions on the film stack 602 to create additional stepped-profiles corresponding to separate protrusion to achieve the example profiles for the DOEs 300, 400, 500 shown in FIGS. 3-5 and/or any other suitable DOE structure. In some examples, the final structure produced by the processes of FIGS. 6-22 is used as a DOE in a VR device (e.g., the VR device 2800 of FIG. 28). In other examples, the final structure produced by the processes of FIGS. 6-22 serves as a mold or master mask used in nanoimprint lithography to make a DOE as described below in connection with FIGS. 23-26.

Figure 23:
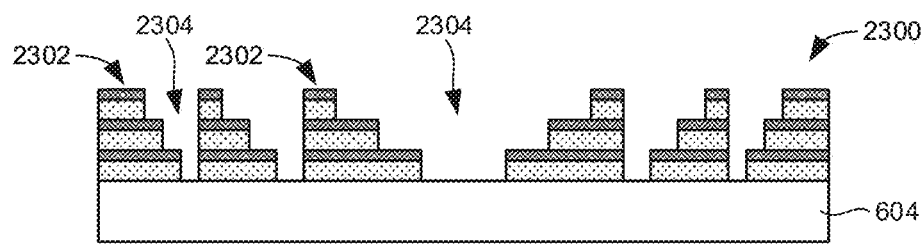
FIGS. 23-26 illustrate example stages to manufacture an example DOE using a master mold fabricated following the example processes illustrated in connection with FIGS. 6-22.

FIGS. 23-26 illustrate example stages to manufacture a DOE 2600 (FIG. 26) using a master mask, stamp, or mold 2300 (FIG. 23) fabricated following the example processes illustrated in connection with FIGS. 6-22. That is, the mold 2300 of FIG. 23 is an example structure that may be formed after following the processes of FIGS. 6-22. In this example, there are four planar surfaces, levels, or steps on the structure including the surface of the substrate 604.

Figure 24:
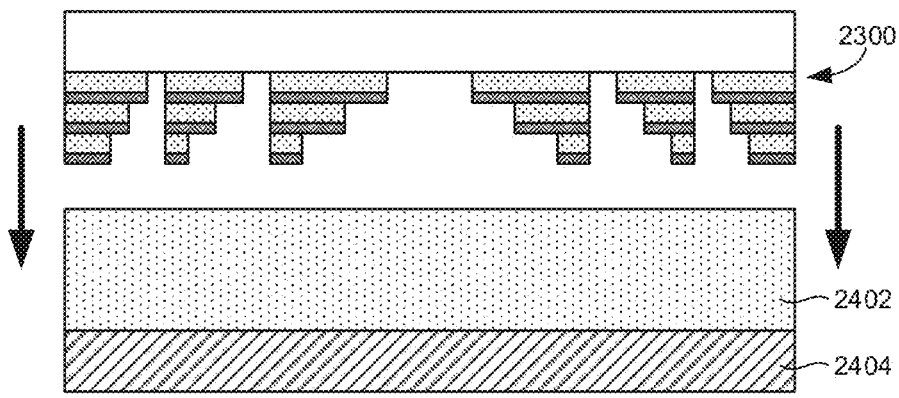
Figure 25:
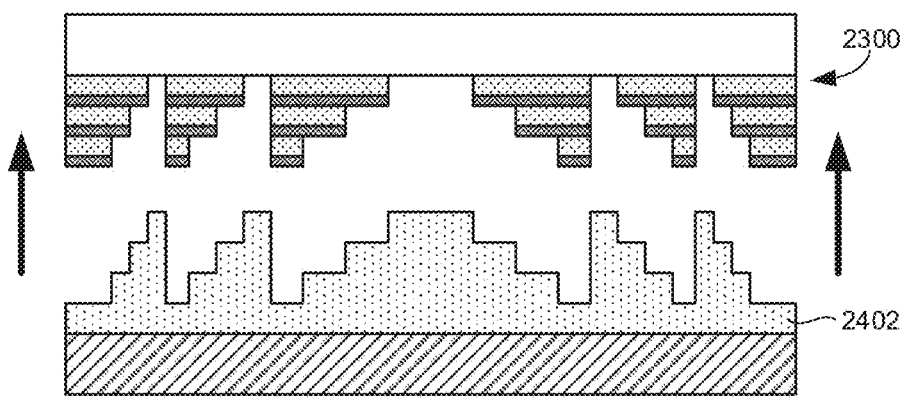
Figure 26:
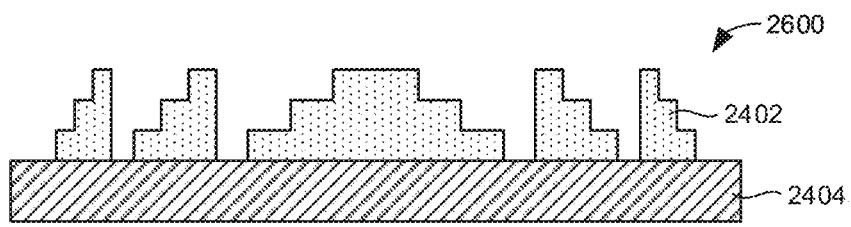

FIG. 24 illustrates the mold 2300 being pressed into a resist 2402 formed on a substrate 2404. FIG. 25 illustrates the mold 2300 being removed from the resist 2402. As shown in the illustrated example, the resulting structure imprinted or stamped into the resist 2402 corresponds to the structure for the DOE. In this example, the structure corresponds to a quaternary lens similar to that shown in FIG. 4. Thus, as can be seen from the illustrated example, the shape of the mold 2300 is complimentary to the final shape of the DOE 2600. In other words, the protrusions 2302 shown in FIG. 2300 are formed with negative space 2304 therebetween (i.e., the gaps or openings between the protrusions 2302) that has a shape corresponding to the final structure of the DOE 2600. FIG. 26 illustrates the result of a pattern transfer process by which the imprinted resist 2402 undergoes a dry etching process (e.g., RIE) to etch the pattern or structure of the resist 2402 down to the underlying substrate 2404 to form the final DOE 2600.

Figure 27:
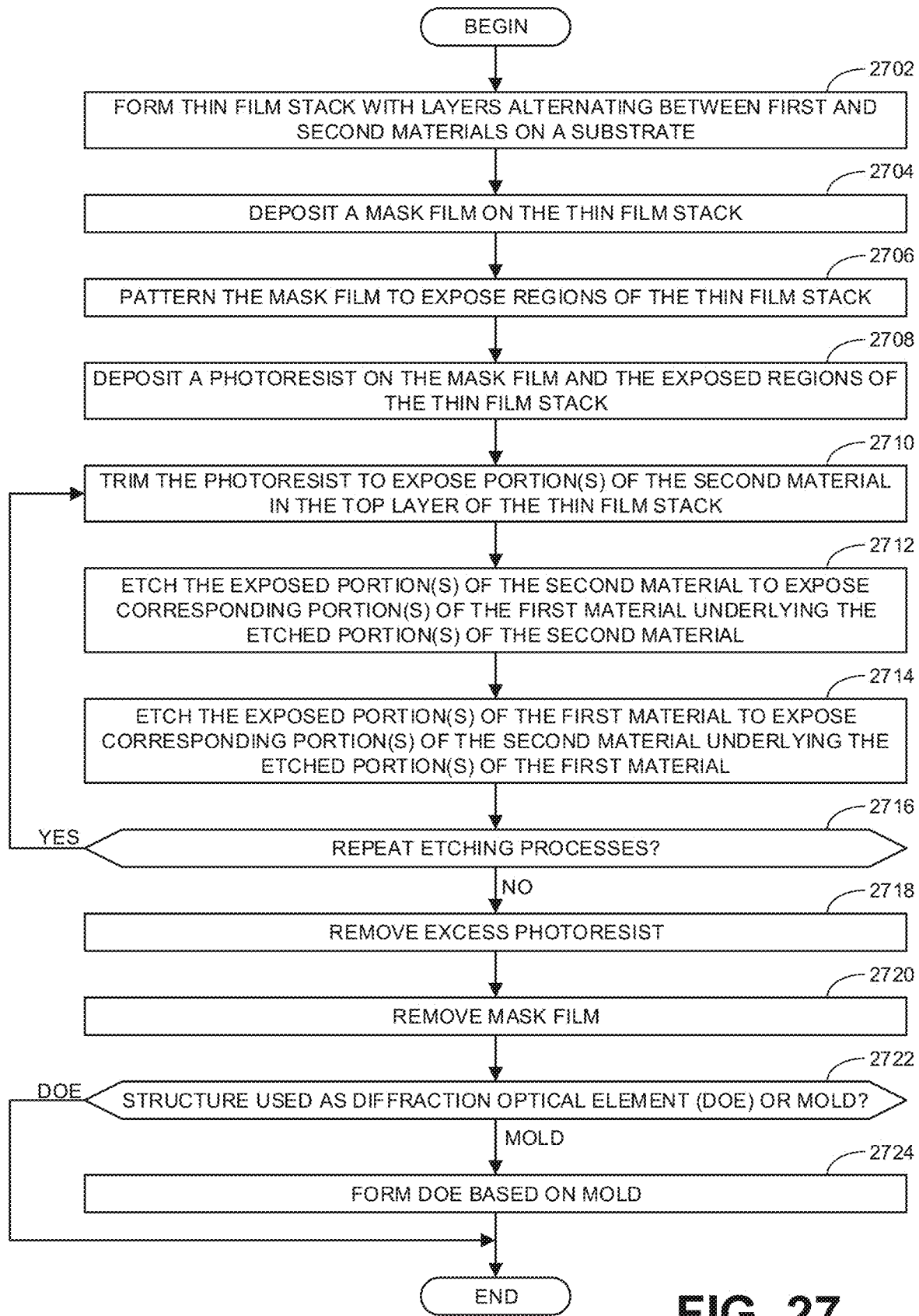
FIG. 27 is a flowchart representative of an example method of manufacturing an example DOE.

FIG. 27 is a flowchart representative of an example method of manufacturing the example DOEs 300, 400, 500, 2600. The example method begins at block 2702 by forming a thin film stack (e.g., the thin film stack 602 of FIG. 6) with layers alternating between first and second materials on a substrate (e.g., the substrate 604). The first and second materials have different material properties resulting in different etch selectivities. In some examples, the first material includes a dielectric material (e.g., the dielectric material 606) while the second material includes a conductive material (e.g., the conductive materials 608). In other example, the first and second materials correspond to different dielectric materials. Either the first material or the second material may be deposited first (e.g., directly on the substrate 604). In some examples, the thicknesses of the layers are controlled to define the heights of individual step features of the final DOE structure. At block 2704, a mask film (the mask film 702) is deposited on the thin film stack 602. At block 2706, the mask film 702 is patterned to expose regions of the thin film stack 602. At block 2708, a photoresist (e.g., the photoresist 802) is deposited on the mask film 702 and the exposed regions of the thin film stack 602.

At block 2710, the photoresist 802 is trimmed to expose portion(s) of the second material 608 in the top layer of the thin film stack 602. This assumes that the second material 608 is the uppermost layer of the thin film stack 602. If the thin film stack 602 ended with the first material 606 in the uppermost layer, then the first material 606 would be exposed. At block 2712, the exposed portion(s) of the second material 608 are etched to expose corresponding portion(s) of the first material 606 underlying the etched portion(s) of the second material 608. At block 2714, the exposed portion(s) of the first material 606 are etched to expose corresponding portion(s) of the second material 608 underlying the etched portion(s) of the first material 606. That is, the portion(s) of the second material 608 exposed by the etching at block 2714 correspond to a lower layer of the second material 608 in the thin film stack 602 than the second material 608 etched at block 2712.

At block 2716, the example method determines whether to repeat the etching processes. Whether the etching processes are repeated is based on the number of alternating layers and the corresponding number of steps for the stair-like structure to be formed. If so, control returns to block 2710 to further trim the photoresist 802 followed by the etching processes of blocks 2712 and 2714. This iterative process results in a controlled stair-like structure because the etching processes act on the portions of the lower layers in the thin film stack 602 that have been exposed by previous etching processes as well as on the newly exposed portions of the uppermost layer due to the trimming of the photoresist 802. If, at block 2716, it is determined that the etching processes are not to be repeated (e.g., the desired stair-like structure is completed), control advances to block 2718 where the excess photoresist 802 is removed. At block 2720, the mask film 702 is removed. At block 2722, the example method determines whether the resulting structure is to be used as a diffraction optical element (DOE) (e.g., the DOEs 300, 400, 500, 2600) or a mold (e.g., the mold 2300). If the structure is to serve as a DOE, the example method of FIG. 27 ends and the completed structure may be installed in a VR device.

If it is determined that the structure is to be used as a mold (block 2722), control advances to block 2724 where a DOE is formed based on the mold. In some examples, the mold is used in a nanoimprint lithography process to stamp a resist (e.g., the resist 2402) with the mold that may undergo additional processing to fabricate the final DOE. Thereafter, the example method of FIG. 27 ends.

Although example methods are described with reference to the flowchart illustrated in FIG. 27, many other methods of manufacturing the example DOEs 300, 400, 500, 2600 in accordance with teachings disclosed herein may alternatively be used. For example, the order of execution of the blocks may be changed, and/or some of the blocks described may be changed, eliminated, or combined. Similarly, additional operations may be included in the manufacturing process before, in between, or after the blocks shown in FIG. 27.

Figure 28:
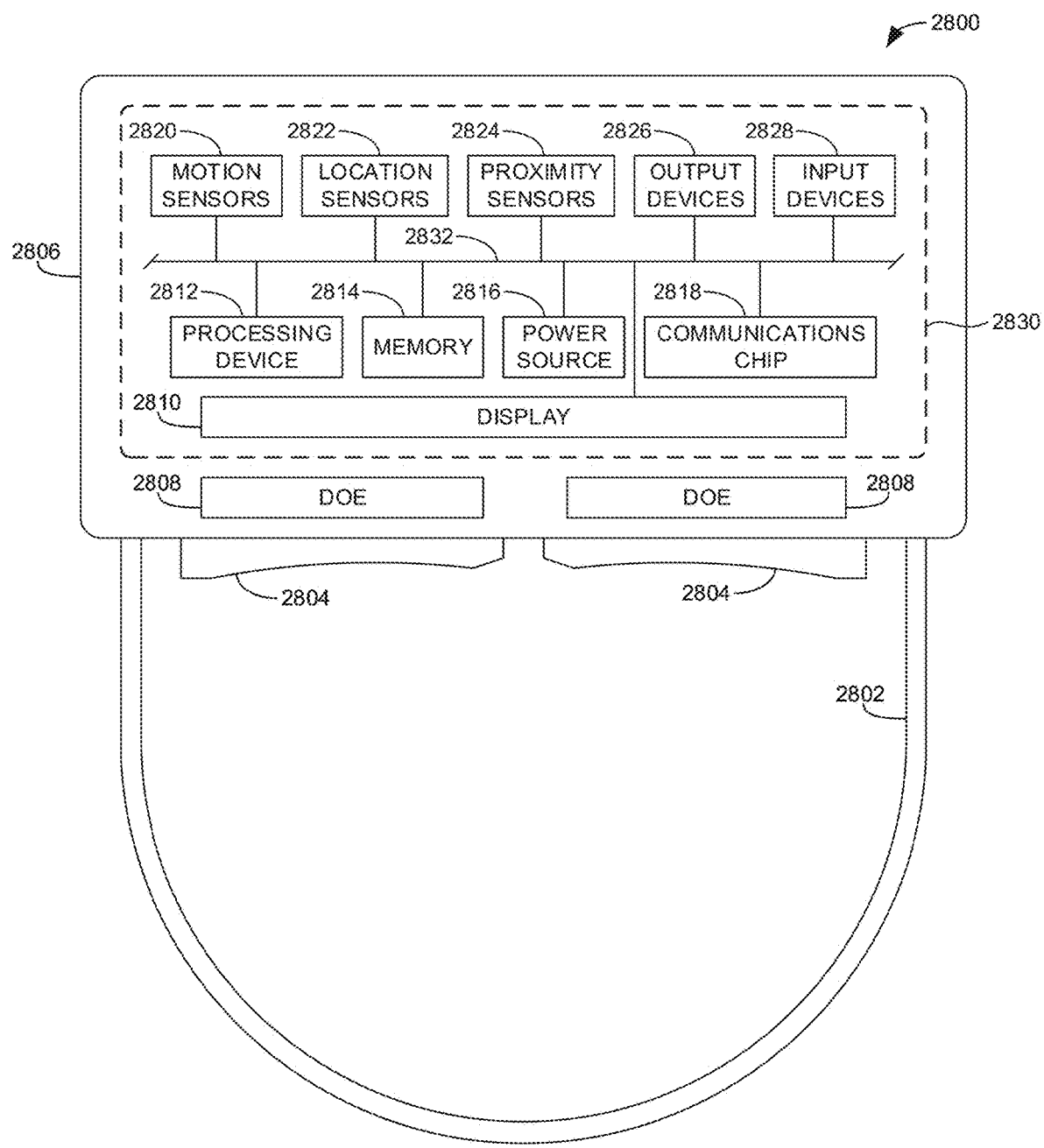
FIG. 28 is a block diagram of an example VR device.

FIG. 28 is a block diagram of an example VR device 2800. In the illustrated example, the VR device 2800 is a head-mounted display that includes a strap 2802 to secure eyepieces 2804 of a main housing 2806 in front of the eyes of a user of the VR device 2800. As shown in the illustrated example, the VR device 2800 includes two DOEs 2808 with one positioned in front of each eyepiece 2804. In some examples, the VR device 2800 may include only one DOE 2808. In other examples, more than two DOEs 2808 may be included in the VR device 2800. In the illustrated example, a display 2810 is positioned adjacent the DOEs 2808 at a distance that will enable the DOEs 2808 to provide an immersive VR experience to a user based on a wide FOV (e.g., greater than 80°) provided by the structure of the DOEs 2808. In some examples, the DOEs 2808 are structured to provide a FOV significantly greater than 80° (e.g., greater than 90°, greater than 100°, greater than 110°, greater than 125°). In addition to such wide FOVs, the example DOEs are significantly thinner than conventional lenses, thereby significantly reducing the overall size and bulkiness of the VR device 2800 compared to known devices for improved usability. For example, VR devices constructed in accordance with teachings disclosed herein may be as much as half the size and weight of VR devices constructed using conventional optics. In some examples, the VR device 2800 may include multiple displays (e.g., separate displays corresponding to each of the DOEs 2808).

As shown in the illustrated example, the VR device 2800 includes a processing device 2812 (e.g., one or more processing devices). As used herein, the term "processing device" or "processor" refers to any hardware/device or portion of a device that processes electronic data from registers and/or memory to perform operations and/or to transform that electronic data into other electronic data that may be stored in registers and/or memory. The processing device 2812 may be implemented by any suitable logic circuit(s) such as one or more digital signal processors (DSPs), application-specific integrated circuits (ASICs), central processing units (CPUs), graphics processing units (GPUs), or any other suitable logic circuit. The example VR device 2800 includes memory 2814, which may itself include one or more memory devices such as volatile memory (e.g., dynamic random access memory (DRAM)), nonvolatile memory (e.g., read-only memory (ROM)), flash memory, solid state memory, and/or a hard drive.

In the example of FIG. 28, the VR device 2800 includes a power source 2816. The power source 2816 may include one or more energy storage devices (e.g., batteries or capacitors) and/or circuitry for coupling components of the VR device 2800 to an energy source separate from the VR device 2800 (e.g., AC line power).

In the illustrated example, the VR device 2800 includes a communication chip 2818 (e.g., one or more integrated circuits structured to perform communications and packaged in one or more packages). For example, the communication chip 2818 may be configured for managing wireless communications for the transfer of data to and from the VR device 2800. The communication chip 2818 may implement any past, present, and/or future wireless standards and/or protocols. Additionally or alternatively, the example communication chip 2818 may manage wired communications, such as electrical, optical, or any other suitable communication protocols (e.g., the Ethernet). As noted above, the communication chip 2818 may include multiple communication chips. For instance, a first communication chip 2818 may be dedicated to shorter-range wireless communications such as Wi-Fi or Bluetooth, and a second communication chip 2818 may be dedicated to longer-range wireless communications. In some examples, a first communication chip 2818 may be dedicated to wireless communications, and a second communication chip 2818 may be dedicated to wired communications.

In some examples, as shown in FIG. 28, the VR device 2800 includes one or more different sensors including, for example motion sensors 2820 (e.g., gyroscopes, accelerometers, etc.), location sensors 2822 (e.g., magnetometers, a compass, global position system sensors, etc.), and/or proximity sensors 2924. The sensor(s) may produce outputs to be processed by the processor(s). Further, the example VR device 2800 includes one or more output devices 2826 (e.g., audio output devices (e.g., speakers), haptic feedback devices, etc.) and/or one or more input devices 2828 (e.g., a microphone, keyboard, keypad, a camera, etc.) The output device(s) may produce humanly sensible visual and/or audio effects in response to signals from the one or more processors. The input device(s) may produce input signals representative of user inputs for processing by the processor(s) and/or for storage in memory.

In some examples, some or all of the components shown within the dashed box 2830 are in communication with one another via one or more buses 2832. Although all of the components described above are shown as being part of (integrated in) the VR device 2800, in some examples, one or more of the components within the dashed box 2830 are implemented by a separate device. In some examples, all of the components within the dashed box 2830 are implemented by a separate device. For example, in some examples, the dashed box 2830 is representative of a smartphone, tablet, or other portable computer device that is mounted to or secured within an opening in the VR device 2800. In such examples, the opening in the housing 2806 of the VR device 2800 is constructed to position the display 2810 of the portable device 2830 at the designated distance from the DOEs 2808. In some examples, where one or more of the components shown in FIG. 28 are not integrated within the example VR device 2800, the VR device may include interface circuitry for coupling the VR device 2800 to such components.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc. may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, and (7) A with B and with C.

From the foregoing, it will be appreciated that example methods, apparatus and articles of manufacture have been disclosed that enable the fabrication of thin diffractive optical elements (DOEs) to significantly reduce the bulkiness of VR devices while incurring lower costs than would be incurred if such DOEs were manufactured using conventional DOE fabrication methods. Furthermore, the precise control of the structure of the DOEs enables lenses with improved quality and wider field-of-views (FOVs) than is possible using conventional lens.

Example 1 includes a diffractive optical element, comprising a substrate, and a thin film stack including alternating layers of a first material and a second material, the thin film stack defining an annular protrusion, the annular protrusion having a stair-like profile, top surfaces of separate ones of steps in the stair-like profile corresponding to top surfaces of separate ones of the layers of the second material.

Example 2 includes the diffractive optical element as defined in example 1, wherein the diffractive optical element is structured to provide a field-of-view of at least 80 degrees for the virtual reality device.

Example 3 includes the diffractive optical element as defined in example 1, wherein the diffractive optical element is structured to provide a field-of-view of at least 110 degrees for the virtual reality device.

Example 4 includes the diffractive optical element as defined in any one of examples 1-3, wherein the first material includes a dielectric material and the second material includes a conductive material.

Example 5 includes the diffractive optical element as defined in example 4, wherein the conductive material includes ruthenium.

Example 6 includes the diffractive optical element as defined in any one of examples 1-5, wherein the annular protrusion is a first annular protrusion and the stair-like profile is a first stair-like profile, the thin film stack defining a second annular protrusion, the second annular protrusion having a second stair-like profile with separate steps having a same height as the steps in the first stair-like profile.

Example 7 includes the diffractive optical element as defined in example 6, wherein a lateral width of the steps in the first stair-like profile are larger than the steps in the second stair-like profile.

Example 8 includes a virtual reality device, comprising a housing to support a display screen, an eyepiece, and a diffractive optical element supported by the housing, the diffractive optical element to be positioned between the eyepiece and the display screen, the diffractive optical element including a first annular step, the first step having a first height defined by a combined thickness of (1) a first layer of a first material and (2) a first layer of a second material stacked on the first layer of the first material, and a second annular step, the second step having a second height defined by a combined thickness of (1) a second layer of the first material stacked on the first layer of the second material and (2) a second layer of the second material stacked on the second layer of the first material.

Example 9 includes the virtual reality device as defined in example 8, wherein the diffractive optical element further includes a third annular step, the third annular step having the first height, and a fourth annular step, the fourth annular step having the second height, the first and second steps associated with a first annular protrusion, the third and fourth steps associated with a second annular protrusion surrounding the first annular protrusion.

Example 10 includes the virtual reality device as defined in example 9, wherein the first and second steps have a first width and the third and fourth steps have a second width, the first width being greater than the second width.

Example 11 includes the virtual reality device as defined in any one of examples 9 or 10, wherein the first height and the second height are substantially the same.

Example 12 includes the virtual reality device as defined in any one of examples 8-11, wherein the first material includes a dielectric material and the second material includes a conductive material.

Example 13 includes the virtual reality device as defined in example 12, wherein the conductive material includes ruthenium.

Example 14 includes a method of manufacturing a diffractive optical element, the method comprising forming a thin film stack on a substrate, the thin film stack including alternating layers of a first material and a second material different than the first material, trimming a photoresist on the thin film stack to expose a first annular portion of an uppermost layer of the thin film stack, the uppermost layer corresponding to the second material, removing the exposed first annular portion of the uppermost layer using a first etching process to expose the first material underlying the uppermost layer, an etch selectivity of the first etching process being greater for the second material than for the first material, and removing the exposed first annular portion of the uppermost layer using a second etching process to expose the second material in a lower layer underlying the first material, an etch selectivity of the second etching process being greater for the first material than for the second material.

Example 15 includes the method as defined in example 14, further including trimming the photoresist to expose a second annular portion of the uppermost layer, repeating the first etching process to remove (1) the exposed second annular portion of the uppermost layer and (2) the exposed second material in the lower layer, and repeating the second etching process to remove portions of the second material exposed by the repeating of the first etching process.

Example 16 includes the method as defined in example 15, wherein the first annular portion has a first width and the second annular portion has a second width, the first width being the same as the second width.

Example 17 includes the method as defined in any one of examples 14-16, further including controlling a width of the first annular portion of the uppermost layer exposed by the trimming of the photoresist based on a width of a step in an annular protrusion of the diffractive optical element.

Example 18 includes the method as defined in any one of examples 14-17, further including repeating the first and second etching processes to shape the thin film stack to have a stepped profile, and pressing the thin film stack with the stepped profile into a resist to form the diffractive optical element.

Example 19 includes the method as defined in any one of examples 14-18, wherein the first material includes a dielectric material and the second material includes a conductive material.

Example 20 includes the method as defined in any one of examples 14-19, further including applying an oxygen containing gas during the first etching process.

Example 21 includes the method as defined in any one of examples 14-19, further including applying a fluorine-carbon containing gas during the second etching process.

Example 22 includes the method as defined in any one of examples 19-22, wherein the conductive material includes ruthenium.

Example 23 includes an apparatus, comprising a substrate, and a thin film stack including alternating layers of a first material and a second material, the thin film stack defining annular protrusions with negative space therebetween, the annular protrusions having stair-like profiles, top surfaces of separate ones of steps in the stair-like profiles corresponding to top surfaces of separate ones of the layers of the second material, the annular protrusions having a shape such that the negative space between the annular protrusions defines a structure for a diffractive optical element when the apparatus is used as a mold during a nanoimprint lithography process.

Example 24 includes the apparatus as defined in example 23, wherein the first material includes a dielectric material and the second material includes a conductive material.

Example 25 includes the apparatus as defined in example 24, wherein the conductive material includes ruthenium.

Example 26 includes the apparatus as defined in any one of examples 23 or 24, wherein a first step of a first one of the annular protrusions has a first lateral width and a first step of a second one of the annular protrusions a second lateral width, the first lateral width being greater than the second lateral width.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. A diffractive optical element, comprising:
   a substrate; and
   a thin film stack including alternating layers of a first material and a second material, the thin film stack defining an annular protrusion protruding from a surface of the substrate, the annular protrusion having a stair-like profile, top surfaces of separate ones of steps in the stair-like profile corresponding to upper surfaces of separate ones of the layers of the second material, the upper surfaces facing away from the substrate, each layer in the thin film stack extending continuously between an inner radial side of the annular protrusion and an outer radial side of the annular protrusion in a direction substantially parallel to the surface of the substrate.

2. The diffractive optical element as defined in claim 1, wherein the diffractive optical element is structured to provide a field-of-view of at least 80 degrees for a virtual reality device.

3. The diffractive optical element as defined in claim 1, wherein the diffractive optical element is structured to provide a field-of-view of at least 110 degrees for a virtual reality device.

4. The diffractive optical element as defined in claim 1, wherein the first material includes a dielectric material and the second material includes a conductive material.

5. The diffractive optical element as defined in claim 4, wherein the conductive material includes ruthenium.

6. The diffractive optical element as defined in claim 1, wherein the annular protrusion is a first annular protrusion and the stair-like profile is a first stair-like profile, the thin film stack defining a second annular protrusion, the second annular protrusion having a second stair-like profile with separate steps having a same height as the steps in the first stair-like profile.

7. The diffractive optical element as defined in claim 6, wherein a lateral width of the steps in the first stair-like profile are larger than the steps in the second stair-like profile.

8. A virtual reality device, comprising:
   a housing to support a display screen;
   an eyepiece; and
   the diffractive optical element of claim 1, the diffractive optical element to be supported by the housing, the diffractive optical element to be positioned between the eyepiece and the display screen, the separate ones of the steps including:
   a first annular step, the first step having a first height defined by a combined thickness of (1) a first layer of the first material and (2) a first layer of the second material stacked on the first layer of the first material; and
   a second annular step, the second step having a second height defined by a combined thickness of (1) a second layer of the first material stacked on the first layer of the second material and (2) a second layer of the second material stacked on the second layer of the first material.

9. The virtual reality device as defined in claim 8, wherein the annular protrusion is a first annular protrusion, the diffractive optical element further includes a second annular protrusion surrounding the first annular protrusion, the second annular protrusion including:
   a third annular step, the third annular step having the first height; and
   a fourth annular step, the fourth annular step having the second height.

10. The virtual reality device as defined in claim 9, wherein the first and second steps have a first width and the third and fourth steps have a second width, the first width being greater than the second width.

11. The virtual reality device as defined in claim 9, wherein the first height and the second height are substantially the same.

12. The virtual reality device as defined in claim 8, wherein the first material includes a dielectric material and the second material includes a conductive material.

13. The virtual reality device as defined in claim 12, wherein the conductive material includes ruthenium.

14. The diffractive optical element of claim 1, wherein each step in the separate ones of the steps is defined by a different adjacent pair of the layers in the thin film stack.

15. The diffractive optical element of claim 1, wherein a distance between the inner radial side and the outer radial side in the direction substantially parallel the surface of the substrate along a first layer of the first material is a first distance, a distance between the inner radial side and the outer radial side in the direction substantially parallel the surface of the substrate along a second layer of the first material is a second distance less than the first distance, a distance between the inner radial side and the outer radial side in the direction substantially parallel the surface of the substrate along a first layer of the second material is a third distance matching the first distance, and a distance between the inner radial side and the outer radial side in the direction substantially parallel the surface of the substrate along a second layer of the second material is a fourth distance matching the second distance.

16. The diffractive optical element of claim 1, wherein a first step of the separate ones of the steps defined by a side surface, the side surface being substantially perpendicular to the top surfaces of the separate ones of the steps, the side surface defined by a first exposed portion of the first material and a second exposed portion of the second material, the first exposed portion of the first material including a full thickness of a first layer of the first material and the second exposed portion of the second material including a full thickness of a first layer of the second material.

17. The diffractive optical element as defined in claim 16, wherein the first exposed portion of the first material corresponds to only the first layer of the first material and the second exposed portion of the second material corresponds to only the first layer of the second material.

18. A diffractive optical element, comprising:
a substrate; and
a thin film stack including alternating layers of a first material and a second material, the thin film stack defining an annular protrusion, the annular protrusion having a stair-like profile, top surfaces of separate ones of steps in the stair-like profile corresponding to upper surfaces of separate ones of the layers of the second material, the separate ones of the steps including a first annular step having a first one of the top surfaces, the upper surfaces facing away from the substrate, the first annular step having a first height corresponding to a first distance between the first top surface and a second one of the top surfaces associated with a second annular step of the separate ones of the steps, the second annular step being closer to the substrate than the first annular step, the first distance corresponding to a combined thickness of (1) a first layer of the first material and (2) a first layer of the second material stacked on the first layer of the first material.

19. The diffractive optical element as defined in claim 18, wherein the separate ones of the steps includes a third annular step having a third one of the top surfaces, the first annular step being closer to the substrate than the third annular step, the third annular step having a second height corresponding to a second distance between the first top surface and the third top surface, the second distance corresponding to a combined thickness of (1) a second layer of the first material stacked on the first layer of the second material and (2) a second layer of the second material stacked on the second layer of the first material.

20. The diffractive optical element as defined in claim 19, wherein the first height is equivalent to the second height within a tolerance of less than +/−5 nm.

21. The diffractive optical element as defined in claim 19, wherein the annular protrusion is a first annular protrusion, the diffractive optical element further including a second annular protrusion surrounding the first annular protrusion, the second annular protrusion including:
a fourth annular step having a fourth top surface, the fourth top surface aligned with the first top surface, the fourth annular step having the first height; and
a fifth annular step having a fifth top surface, the fifth top surface aligned with the third top surface, the fifth annular step having the second height.

22. The diffractive optical element as defined in claim 21, wherein the first and third annular steps have a first width and the fourth and fifth annular steps have a second width, the first width being greater than the second width, the first and second widths measured in a direction parallel to the layers of the thin film stack.

* * * * *